US012765351B2

(12) United States Patent
Darmawikarta et al.

(10) Patent No.: US 12,765,351 B2
(45) Date of Patent: Oct. 13, 2026

(54) GLASS SUBSTRATES HAVING PARTIALLY EMBEDDED CONDUCTIVE LAYERS FOR POWER DELIVERY IN SEMICONDUCTOR PACKAGES AND RELATED METHODS

(71) Applicant: Intel Corporation, Santa Clara, CA (US)

(72) Inventors: Kristof Darmawikarta, Chandler, AZ (US); Srinivas V. Pietambaram, Chandler, AZ (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 354 days.

(21) Appl. No.: 17/485,034

(22) Filed: Sep. 24, 2021

(65) Prior Publication Data

US 2023/0094686 A1 Mar. 30, 2023

(51) Int. Cl.
*H10W 20/42* (2026.01)
*H10W 20/00* (2026.01)
(Continued)

(52) U.S. Cl.
CPC ......... *H10W 20/42* (2026.01); *H10W 20/056* (2026.01); *H10W 20/427* (2026.01); *H10W 70/692* (2026.01); *H10W 72/00* (2026.01)

(58) Field of Classification Search
CPC ........... H01L 23/5226; H01L 21/76877; H01L 23/15; H01L 23/50; H01L 23/5286;
(Continued)

(56) References Cited

U.S. PATENT DOCUMENTS 5,500,278 A 3/1996 Nagasaka
2004/0150966 A1* 8/2004 Hu ...................... H10W 44/401 257/E23.079
(Continued)

FOREIGN PATENT DOCUMENTS

DE 102016224943 A1 * 6/2018
WO WO-2008053956 A1 * 5/2008 ............ H05K 1/113

OTHER PUBLICATIONS

European Patent Office, "Extended European Search Report," in connection with European Patent Application No. 22197128.6, issued Feb. 21, 2023, 8 pages.
(Continued)

*Primary Examiner* — Caleb E Henry
*Assistant Examiner* — Pratiksha Jayant Lohakare
(74) *Attorney, Agent, or Firm* — Hanley, Flight & Zimmerman, LLC

(57) ABSTRACT

Glass layers having partially embedded conductive layers for power delivery in semiconductor packages and related methods are disclosed. An example semiconductor package includes a core layer having a thickness between a first surface opposite a second surface. The core layer includes a trench provided in the first surface. The trench partially extending between the first surface and the second surface. An electrically conductive material is positioned in the trench. A trace is provided on the conductive material. The trace is offset in a direction away from the first surface and away from the second surface of the core layer.

20 Claims, 5 Drawing Sheets

(51) Int. Cl.
*H10W 20/41* (2026.01)
*H10W 70/692* (2026.01)
*H10W 72/00* (2026.01)

(58) Field of Classification Search
CPC ........... H01L 21/4857; H01L 23/49827; H01L 23/49822; H05K 3/24; H05K 2201/0338; H05K 2201/0347; H05K 1/0265; H05K 1/0306; H05K 3/1258
USPC .......................................................... 257/774
See application file for complete search history.

(56) References Cited

U.S. PATENT DOCUMENTS

2007/0045816 A1 3/2007 Natarajan et al.
2009/0158581 A1* 6/2009 Nguyen ................. H05K 3/108 324/754.01
2009/0282674 A1* 11/2009 Chen .................... H05K 1/0265 174/262
2010/0239857 A1* 9/2010 Tarng ........................ B32B 5/22 428/339
2010/0252315 A1* 10/2010 Liao ....................... H05K 1/111 174/260
2011/0001231 A1* 1/2011 Lovskog ............... H10W 70/65 257/E23.012
2014/0131866 A1* 5/2014 Young ................. H10W 70/685 257/738
2015/0250058 A1 9/2015 Ramachandran et al.
2017/0170111 A1* 6/2017 Reingruber .............. C25D 5/10
2017/0373133 A1* 12/2017 Liao ......................... H10D 1/20
2018/0019197 A1* 1/2018 Boyapati ........... H01L 23/49866
2019/0393172 A1* 12/2019 Pietambaram .......... H01L 24/19

OTHER PUBLICATIONS

European Patent Office, "Communication pursuant to Article 94(3) EPC," issued in connection with European Patent Application No. 22197128.6, dated Jun. 22, 2026, 9 pages.

* cited by examiner

GLASS SUBSTRATES HAVING PARTIALLY EMBEDDED CONDUCTIVE LAYERS FOR POWER DELIVERY IN SEMICONDUCTOR PACKAGES AND RELATED METHODS

FIELD OF THE DISCLOSURE

This disclosure relates generally to integrated circuit packaging and, more particularly, to glass substrates having partially embedded conductive layers for power delivery in semiconductor packages and related methods.

BACKGROUND

Integrated circuits (IC) chips and/or semiconductor dies are routinely connected to larger circuit boards such as motherboards and other types of printed circuit boards (PCBs) via a package substrate. As integrated circuit (IC) chips and/or dies reduce in size and interconnect densities increase, alternatives to traditional layers are needed for providing stable transmission of high frequency data signals between different circuitry and/or increased power delivery.

Figure 1:
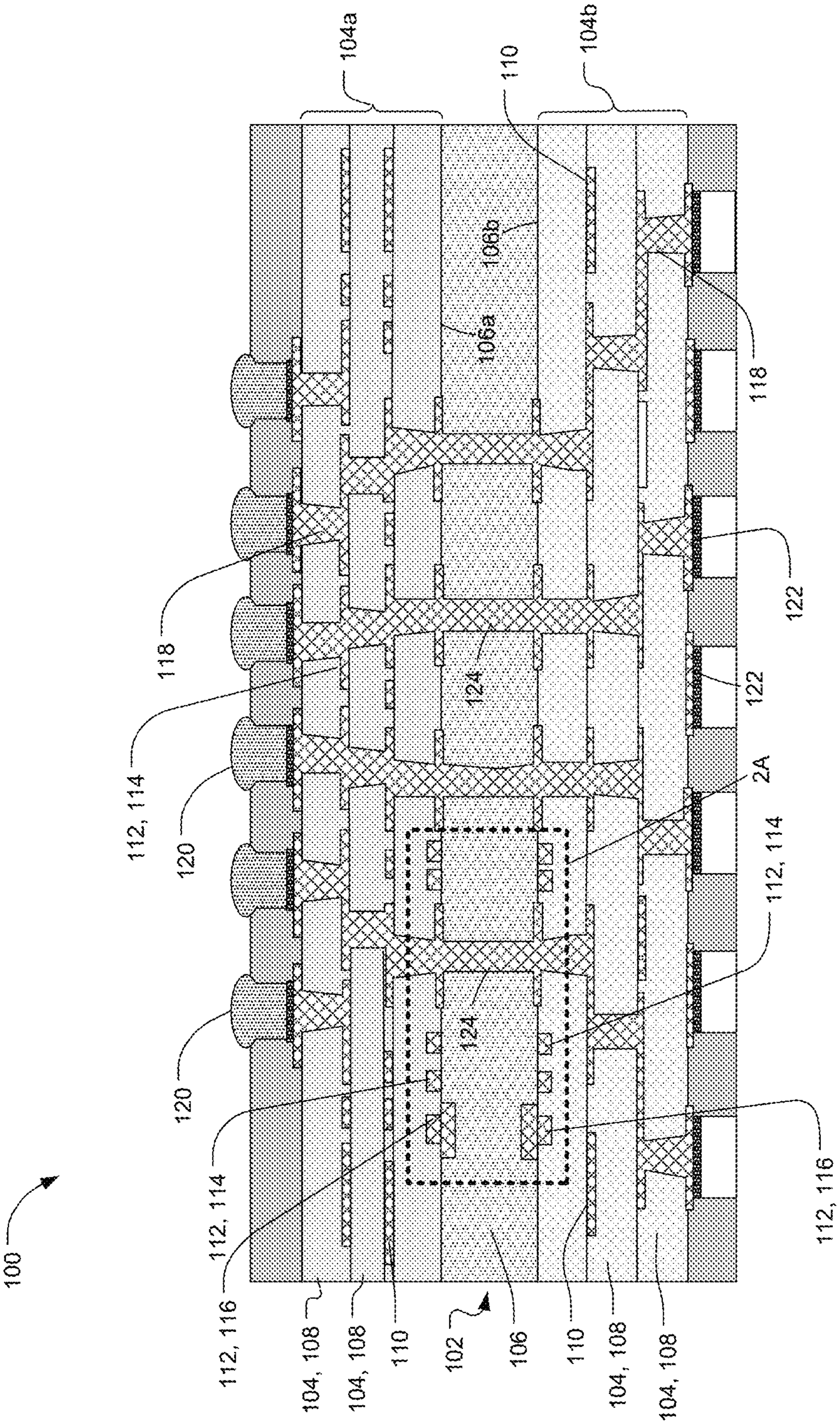
FIG. 1 is a cross-sectional view of an example semiconductor package including an example glass substrate constructed in accordance with teachings of this disclosure.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are created. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or created on, provided on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc.

DETAILED DESCRIPTION

Advances in semiconductor packaging architectures result in increased demands on the material properties of the package substrate. For example, as package substrates become thinner to achieve a lower profile, a core of the substrate having a small thickness can be susceptible to warping or bending over time, thereby reducing the functionality of the package substrate. For example, for smaller sized package assemblies (e.g., thin or low profile packages for mobile or other devices), a core of the substrate assembly needs to have improved total thickness variation (TTV), lower coefficient of thermal expansion (CTE), lower shrinkage, and higher elastic modulus. To improve such characteristics of a package substrate, glass layers can be employed. In some examples, package substrates can include a layer or substrate made of glass to restrict or prevent the package assembly from warping or bending from its initial manufactured shape over time. The glass substrate can include, for example, a core layer, an interposer and/or any other layer of a semiconductor package.

Furthermore, in high density, high speed interconnect substrates, increased power delivery is needed to improve substrate efficiency. As used herein, the terms "high speed signals or high frequency signals" can refer to any or all signals with frequencies that fall within the portion of the electromagnetic frequency spectrum that extends from about 300 GHz to about 1 THz, or more.

Such increased power delivery is often improved by increasing a thickness of the conductive traces that carry power. In contrast, to transmit multiple and/or high frequency signals between package components, semiconductor packages often employ planar transmission lines such as microstrip, stripline, and coplanar transmission lines to transmit signals and/or power. However, high frequency signals transmitted over such transmission lines (e.g., a stripline, a microstrip, etc.) can be lossy, as a thickness of the signaling lines increases. Thus, power delivery desires thicker conductive traces (e.g., copper lines) to increase conductivity and/or reduce resistivity, while signal routing uses thinner conductive traces (e.g., copper traces) for impedance and/or fanout/breakout patterning requirements to enable signals to travel to different operatively coupled dies (e.g., without or reduced interference). Such compromises between power delivery and signaling apply to both build-up layers and core layers.

However, increasing a thickness of a power trace often results in an increased thickness of a signaling trace during manufacturing. For example, a trace thickness is provided (e.g., increased in a vertical or stack-up direction) via photolithography or other manufacturing techniques. Thus, creation of the power traces also includes creating signaling traces (e.g., via photolithography techniques) because the power traces and the signaling traces are often provided in the same or common build-up layer. Thus, increasing a thickness of a power trace can negatively affect signaling performance. Therefore, there is a compromise between a thickness of power delivery lines and a thickness of the signaling lines.

Examples disclosed herein employ a dual conductive trace (e.g., dual copper lines) for power delivery enhancement without negatively affecting signaling performance. Specifically, examples disclosed herein employ power lines that extend in different layers, while the signaling lines extend in a single build-up layer. As a result, the power lines have a thickness that is greater than a thickness of a signal line. To increase a thickness of a power line while maintaining or decreasing a thickness of the signal line, example power lines disclosed herein have a first portion that is created in an example build-up layer with a signal line. Thus, in some examples disclosed herein, a first portion of a power line has a first thickness that is similar or equal to a thickness of a signal line provided in the same build-up layer as the first portion of the power line. Additionally, a second portion of the power line is provided in a different layer or substrate (e.g., a glass substrate) of the semiconductor package, thereby increasing the thickness of the power line. The signal line, on the other hand, is not provided in other layers.

Example methods and apparatus disclosed herein employ a trench provided in a glass substrate or core layer that is subsequently filled with conductive material (e.g., copper) to provide additional metal volume to increase an effective conductive thickness of power delivery lines or traces of a package substrate. In other words, the additional conductive material provided in the trench creates an effectively thicker metal or trace for power delivery application(s), while traces provided for signaling are not impacted by the additional added thickness. For instance, example trenches or recessed channels disclosed herein are not provided adjacent traces used for signaling. In other words, conductive material filled trenches disclosed herein are only provided for traces that are used for power delivery. Thus, build-up layers provided on an example glass substrate disclosed herein including traces for power delivery and signaling can maintain the same thickness. As a result, examples disclosed herein enable improved or optimized power delivery without impacting, affecting or otherwise interfering with signaling application(s) (e.g., fan routing in the core layers and/or other signaling lines). In other words, the additional power delivery lines provided via trenches in the glass substrate of examples disclosed herein do not affect impedance (e.g., an impedance range) of the signaling lines because the additional thickness added is provided only for power lines of the semiconductor package.

As used herein, "trench" is used to define a channel, opening or recess that extends partially in a glass substrate. To this end, in some examples, trench and channel are used interchangeable to define an opening in the glass substrate that partially extends into the glass substrate to provide a bottom or base surface of the trench located between a first surface (e.g., an upper surface) of the glass substrate and a second surface (e.g., a lower surface) of the glass substrate.

Example semiconductor dies or chiplets disclosed herein can implement controllers, microprocessors, Digital Signal Processors (DSPs), Central Processor Units (CPUs), Graphics Processor Units (GPUs), programmed microprocessors, Field Programmable Gate Arrays (FPGAs), Application Specific Integrated Circuits (ASICs), Reduced Instruction Set Computers (RISCs), any other circuitry and/or combinations thereof. Additionally, example semiconductor dies disclosed herein (e.g., semiconductor dies 104*a*, 104*b* of FIGS. 1A and 1B) may be chiplets of a disaggregated die. Each chiplet (also referred to as a tile) may implement a dedicated function. Together, the chiplets may implement a complex circuitry. The complex circuitry can be any type of device that can be implemented as a plurality of chiplets that are physically separated from, but communicatively coupled to, one another. For example, processor circuitry may be implemented by two or more separate chiplets that together implement a microprocessor, etc. Alternatively, in other examples, example semiconductor dies disclosed herein may be different chips (e.g., a processor circuitry, a memory, and/or or some other type of component) that together implement a system on a chip (SoC) in a semiconductor package.

FIG. 1 is a cross-sectional view of an example semiconductor package 100 including an example glass substrate 102 (e.g., a glass core layer) in accordance with teachings of this disclosure. The semiconductor package 100 of the illustrated example includes a plurality of build-up layers 104 and a core layer 106. Specifically, the build-up layers 104 are provided on a first surface 106*a* of the core layer 106 and a second surface 106*b* of the core layer 106 opposite the first surface 106*a*. The build-up layers 104 of the illustrated example are provided in an alternating pattern of insulation or dielectric layers 108 and conductive layers 110 (e.g., patterned electrically) creating a plurality of traces 112 between the dielectric layers 108. The traces 112 of the illustrated example define signal traces 114 (e.g., signaling lines) to transfer signals or information between various components (e.g., transistors, capacitors, resistors, backend layers, etc. and/or other circuitry) of the semiconductor package 100 and power traces 116 for transferring or carrying power to the various components of the semiconductor package 100. Electrically conductive vias 118 (e.g., copper plated vias) extend through the dielectric layers 108 and electrically interconnect the conductive layers 110 (e.g., traces 114) of the different build-up layers 104. In the illustrated example, the semiconductor package 100 includes a plurality of solder connectors 120 (e.g., solder balls) and a plurality of solder pads 122 to electrically couple the semiconductor package 100 to a printed circuit board, an interposer and/or any other substrate(s).

The glass substrate 102 of the illustrated example defines or provides the core layer 106. Thus, the core layer 106 of the illustrated example is composed of glass. The core layer 106 of the illustrated example is positioned between a first plurality 104*a* of the build-up layers 104 (e.g., on the first surface 106*a* of the core layer 106) and a second plurality 104*b* of the build-up layers 104 (e.g., on the second surface 106*b* of the core layer 106). To communicatively and/or electrically couple one or more of the first plurality 104*a* of the build-up layers 104 and one or more of the second plurality 104*b* of build-up layers 104, the core layer 106 of the illustrated example employs a plurality of through glass vias (TGVs) 124 (e.g., copper plated vias). Although the glass substrate 102 of the illustrated example is the core layer 106 of the semiconductor package 100, in some examples, the glass substrate 102 can be an interposer and/or any other layer of the semiconductor package 100. For example, the glass substrate 102 can be used in place of one or more of the dielectric layers 108 of the semiconductor package 100.

Figures 2A, 2B, 2C:
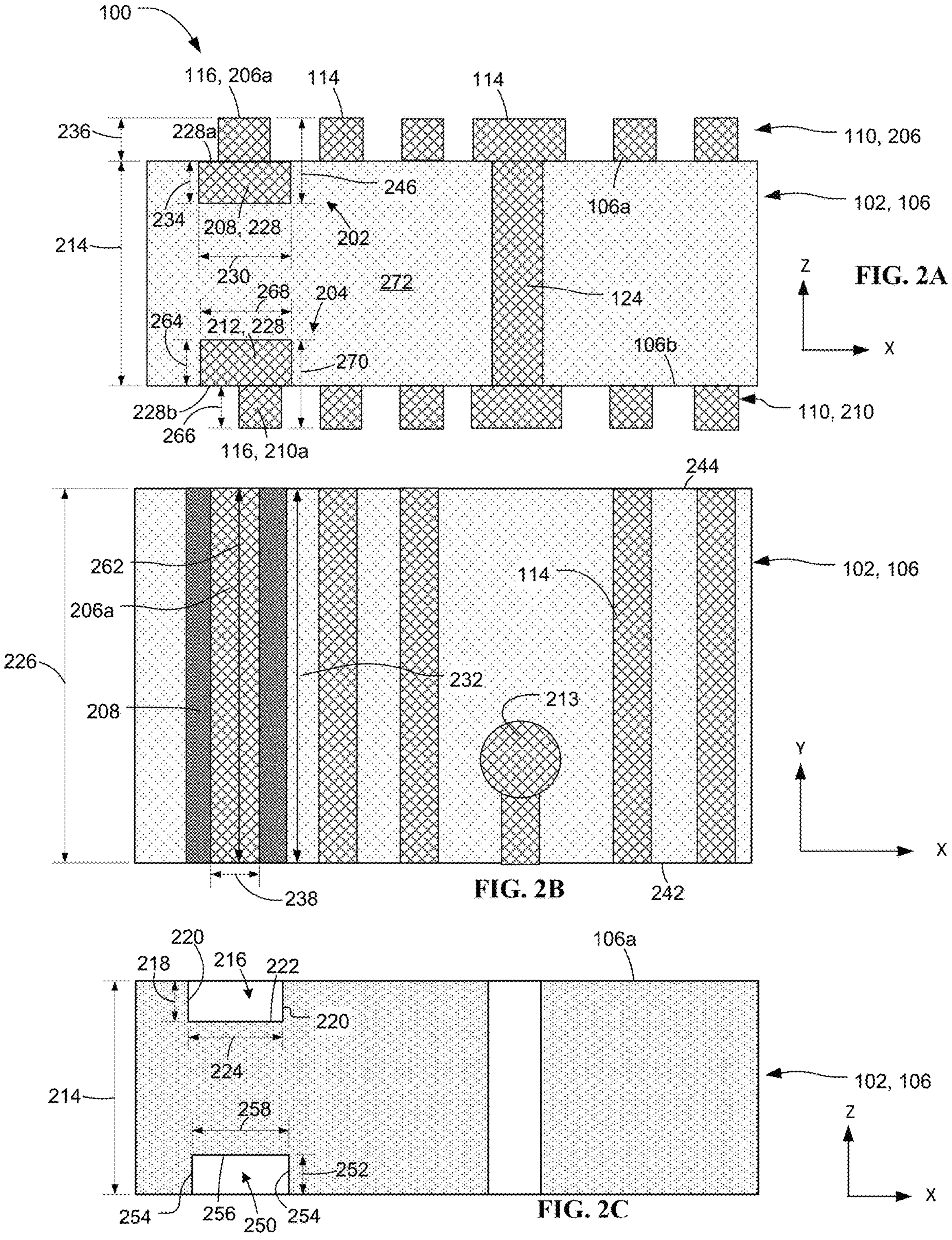
FIG. 2A is a partial, enlarged view of the example semiconductor package of FIG. 1.
FIG. 2B is a partial top view of the example glass substrate and an example conductive layer of the example semiconductor package of FIG. 2A.
FIG. 2C is a cross-sectional view of the example glass substrate of FIG. 2A but shown without conductive material.

FIG. 2A is a partial, enlarged view of the semiconductor package 100 of FIG. 1. FIG. 2B is a partial top view of FIG. 2A. FIG. 2C is a partial, enlarged view of the glass substrate 102 of FIG. 2A. As noted above, the semiconductor package 100 of the illustrated example includes the power traces 116 and the signal traces 114. The power traces 116 of the illustrated example at least partially define a first power line 202 and a second power line 204.

For example, the first power line 202 of the illustrated example is provided by a first power trace 206*a* of the first conductive layer 206 of the conductive layers 110 and a second conductive layer 208 provided with the glass substrate 102. The first conductive layer 206 of FIG. 2A, for example, also provides the signal traces 114 on the first surface 106*a* of the core layer 106. For example, the first conductive layer 206 provides the signal traces 114 and the first power trace 206*a* on the first surface 106*a* of the core layer 106. As shown in FIG. 2A, the second conductive layer 208 in the glass substrate 102 is associated only with the first power line 202. In FIG. 2B, the traces 114 include a pad 213 to couple the traces 114 to different layers. For example, the pad 213 couples the trace 114 to the TGV 124. Each of the traces 114 can terminate at a pad.

Similarly, the second power line 204 of the illustrated example is provided by a second power trace 210*a* of the third conductive layer 210 of the conductive layers 110 and a fourth conductive layer 212 provided with the glass substrate 102. The third conductive layer 210 of FIG. 2A, for example, also provides the signal traces 114 on the second surface 106*b* of the core layer 106. For example, the third conductive layer 210 provides the signal traces 114 and the second power trace 210*a* on the second surface 106*b* of the core layer 106. As shown in FIG. 2A, the fourth conductive layer 212 of the glass substrate 102 is associated only with the second power line 204. In some examples, the semiconductor package 100 can include only the first power line 202 or the second power line 204. In some examples, the semiconductor package 100 or the glass substrate 102 can include more than two power lines.

Referring to FIGS. 2A-2C, the glass substrate 102 of the illustrated example has an overall thickness 214 between the first surface 106*a* and the second surface 106*b*. In the orientation of FIG. 2A, the overall thickness 214 extends in a z-direction of a reference cartesian coordinate system (e.g., a vertical or stack-up/build-up direction in the orientation of FIG. 1). In some examples, the overall thickness 214 can be between 100 micrometers (μm) and 1 millimeter (mm). In some examples, the overall thickness 214 of the illustrated example can be approximately 10 to 50 times greater than a thickness of a build-up layer (e.g., the build-up layers 104 of FIG. 1). The glass substrate 102 of the illustrated example can be composed of glass material(s) including, but not limited to, borosilicate, quartz, fused silica, and/or any other suitable material(s).

To define the second conductive layer 208 and/or the first power line 202, the glass substrate 102 of the illustrated example includes a first trench or a first recessed channel 216 (FIG. 2C). The first recessed channel 216 of the illustrated example is provided in the first surface 106*a* of the glass substrate 102. Specifically, the first recessed channel 216 partially extends between the first surface 106*a* and the second surface 106*b* in the z-direction (e.g., vertical direction). Thus, the first recessed channel 216 is offset (e.g., in the z-direction) from the first surface 106*a* in a direction away from the first surface 106*a* and toward the second surface 106*b* to define a first depth 218. In the orientation of FIG. 2A, the first depth 218 extends in the z-direction (e.g., a vertical or stack-up/build-up direction in the orientation of FIG. 1). In other words, the first recessed channel 216 does not completely pass through and/or does not completely extend through the glass substrate 102 between the first surface 106*a* and the second surface 106*b*.

In particular, the first recessed channel 216 includes side walls 220 and a base wall 222 (e.g., a bottom wall). The base wall 222 is offset (e.g., in the z-direction) relative to the first surface 106*a*. The side walls 220 of the illustrated example are substantially parallel relative to each other and substantially perpendicular relative to the base wall 222 and/or the first surface 106*a*. As used herein, "substantially parallel" means perfectly parallel or within 10 degrees of perfectly parallel. Similarly, as used herein, "substantially perpendicular" means perfectly perpendicular (e.g., 90 degree perpendicularity) or within 10 degrees of perfectly perpendicular (e.g., 80 degrees). In some examples, the side walls 220 can taper from the first surface 106*a* toward the base wall 222 (e.g., providing angled walls, 45-degree sloped walls, etc.). Thus, the first depth 218 is defined by a height of the side walls 220 between the first surface 106*a* and the base wall 222. In other words, the first depth 218 is less than the overall thickness 214. For example, the first depth 218 of the illustrated example can be between 5 micrometers and 20 micrometers (e.g., 10 micrometers). In some examples, the first depth 218 can go up to 200 micrometers (μm) depending on the overall thickness 214. Additionally, the first recessed channel 216 of the illustrated example has an example width 224 and an example length 226 (e.g., a partial length) (FIG. 2B). For instance, the width 224 of the illustrated example extends in an x-direction of the reference cartesian coordinate system and the length 226 (e.g., a partial length) extends in a y-direction of the reference cartesian coordinate system in the orientations of FIGS. 2A-2C. The x-direction and the y-direction of the illustrated example are in-plane directions.

In the illustrated example of FIGS. 2A and 2B, an electrically conductive material 228 is positioned in the first recessed channel 216 to define the second conductive layer 208. For example, the first recessed channel 216 of the illustrated example is filled with the conductive material 228. The conductive material 228 of the illustrated example includes, but not limited to, copper, aluminum, metal and/or any other electrically conductive material(s). When the conductive material 228 is positioned in the first recessed channel 216 of the glass substrate 102, the conductive material 228 has dimensions or a shape similar to the dimensions and/or the shape of the first recessed channel 216 (e.g., an electrical trace). For example, the conductive material 228 has a width 230 (e.g., in the x-direction), a length 232 (e.g., in the y-direction), and a thickness 234 (e.g., in the z-direction). Additionally, the conductive material 228 of the first recessed channel 216 of the illustrated example is flush relative to the first surface 106*a*. In other words, an outer surface 228*a* of the conductive material 228 of the first recessed channel 216 is substantially flush relative to the first surface 106*a* such that the conductive material 228 does not create a step (e.g., a recess or protrusion or bump) relative to the first surface 106*a*. As used herein, substantially flush means that the surfaces 228*a*, 106*a* are perfectly even in the same plane (e.g., a plane in the x-y direction) or slightly offset relative to each within a value not exceeding 2 percent (2%). Thus, a transition between the outer surface 228*a* and the first surface 106*a* is relatively smooth or uninterrupted.

The first power trace 206*a* of the first conductive layer 206 is coupled to or provided on the conductive material 228 positioned in the first recessed channel 216. In particular, the first power trace 206*a* of the illustrated example protrudes in a direction away from the first surface 106*a* and away from the second surface 106*b* of the glass substrate 102. For example, the first power trace 206*a* of the illustrated example has a thickness 236 (e.g., in the z-direction)(e.g., measured from the outer surface 228*a* of the conductive material 228 of the first recessed channel 216). The first power trace 206*a* of the illustrated example has a width 238 (e.g., in the x-direction) and a length 240 (e.g., in the y-direction). The first power trace 206*a* and the conductive material 228 of the first recessed channel 216 of the illustrated example are the same material (e.g., copper). In some examples, the first power trace 206*a* and the conductive material 228 of the first recessed channel 216 can be different materials. For instance, the conductive material 228 can be aluminum and the first power trace 206*a* can be copper.

In the illustrated example, the first power trace 206*a* and the second conductive layer 208 (e.g., the conductive material 228 of the first recessed channel 216) define the first power line 202 for transmitting power for the semiconductor package 100. To define the first power line 202, the first power trace 206*a* at least partially aligns or overlaps with the conductive material 228 (e.g., in the x-direction and/or the y-direction) of the first recessed channel 216. The first recessed channel 216 and, thus, the conductive material 228 extends in a direction between a first end 242 (FIG. 2B) of the glass substrate 102 and a second end 244 (FIG. 2B) of the glass substrate 102 along a path defined by the first power trace 206*a*.

In the illustrated example, the first power line 202 has a thickness 246. For instance, the thickness 234 of the conductive material 228 of the first recessed channel 216 and the thickness 236 of the first power trace 206*a* define the thickness 246 of the first power line 202. As a result, a first portion (e.g., the conductive material 228) of the first power line 202 extends in an interior (e.g., extends inside or into) the glass substrate 102 and a second portion (e.g., the first power trace 206*a*) of the first power line 202 protrudes from an exterior (e.g., the first surface 106*a*) of the glass substrate 102. As a result, the first power line 202 has an increased thickness (e.g., the thickness 246) in the z-direction via the first power trace 206*a* and the conductive material 228 of the first power line 202 (e.g., compared to, for example, the signal line 114 or the first power line 202 without the conductive material 228 in the first recessed channel 216). Increasing the thickness 246 of the first power line 202 in the z-direction significantly increases a power capacity of the power trace compared to a power capacity of the first power line 202 without an additional thickness (e.g., the thickness 234) of the conductive material 228 provided in the first recessed channel 216.

To define the fourth conductive layer 212 and/or the second power line 204, the glass substrate 102 of the illustrated example includes a second trench or a recessed channel 250 (FIG. 2C). The second recessed channel 250 of the illustrated example is provided in the second surface 106*b* of the glass substrate 102. Specifically, the second recessed channel 250 partially extends between the first surface 106*a* and the second surface 106*b* in the z-direction (e.g., vertical direction). Thus, the second recessed channel 250 is offset (e.g., in the z-direction) from the second surface 106*b* in a direction away from the second surface 106*b* and toward the first surface 106*a* to define a second depth 252. In the orientation of FIG. 2A, the second depth 252 extends in the z-direction (e.g., a vertical or stack-up/build-up direction in the orientation of FIG. 1).

In particular, the second recessed channel 250 includes side walls 254 and a base wall 256 (e.g., a bottom wall). The base wall 256 is offset (e.g., in the z-direction) relative to the second surface 106*b*. The side walls 254 of the illustrated example are substantially parallel relative to each other and substantially perpendicular relative to the base wall 256 and/or the second surface 106*b*. In some examples, the side walls 254 can taper from the second surface 106*b* toward the base wall 256 (e.g., providing angled walls, 45-degree sloped walls, etc.). Thus, the second depth 252 is defined by a height of the side walls 254 between the second surface 106*b* and the base wall 256 (e.g., a top wall in the orientation of FIG. 2C). In other words, the second depth 252 is less than the overall thickness 214. For example, the second depth 252 of the illustrated example can be between 5 micrometers and 20 micrometers (e.g., 10 micrometers). Additionally, the second recessed channel 250 of the illustrated example has an example width 258 (e.g., in the x-direction) and an example length (e.g., extending between the first end 242 and the second end 244 of FIG. 2B). In the illustrated example, the first recessed channel 216 is substantially similar or identical to the second recessed channel 250. For example, the first depth 218, the width 224 and the length 226 of the first recessed channel 216 are substantially similar (e.g., within a 2% tolerance) or identical to the second depth 252, the width 258 and the length of the second recessed channel 250, respectively.

In the illustrated example of FIGS. 2A and 2B, the electrically conductive material 228 is positioned in the second recessed channel 250 to define the fourth conductive layer 212. When the conductive material 228 is positioned in the second recessed channel 250 of the glass substrate 102, the conductive material 228 has dimensions or a shape similar to (e.g., identical) the dimensions and/or the shape of the second recessed channel 250 (e.g., an electrical trace). For example, the conductive material 228 in the second recessed channel 250 has a width 268 (e.g., in the x-direction), a length (e.g., in the y-direction), and a thickness 264 (e.g., in the z-direction). Additionally, the conductive material 228 of the second recessed channel 250 of the illustrated example is flush relative to the second surface 106*b*. In other words, an outer surface 228*b* of the conductive material 228 of the second recessed channel 250 is substantially flush relative to the second surface 106*b* such that the conductive material 228 of the second recessed channel 250 does not create a step (e.g., a recess or protrusion or bump) relative to the second surface 106*b*.

The second power trace 210*a* of the third conductive layer 210 is coupled to or provided on the conductive material 228 positioned in the second recessed channel 250. In particular, the second power trace 210*a* of the illustrated example protrudes in a direction away from the second surface 106*b* and away from the first surface 106*a* of the glass substrate 102. For example, the second power trace 210*a* of the illustrated example has a thickness 266 (e.g., in the z-direction)(e.g., measured from the outer surface 228*b* of the conductive material 228 of the second recessed channel 250). The second power trace 210*a* of the illustrated example has a width 268 (e.g., in the x-direction) and a length (e.g., similar to the length 240 of the first power trace 206*a* in the y-direction).

In the illustrated example, the second power trace 210*a* and the third conductive layer 210 (e.g., the conductive material 228) define the second power line 204 for transmitting power for the semiconductor package 100. To define the second power line 204, the second power trace 210*a* at least partially aligns or overlaps with the conductive material 228 (e.g., in the x-direction and/or the y-direction) of the second recessed channel 250. The second recessed channel 250 and, thus, the conductive material 228 extends in a direction between the first end 242 (FIG. 2B) of the glass substrate 102 and the second end 244 (FIG. 2B) of the glass substrate 102 along a path defined by the second power trace 210*a*.

In the illustrated example, the second power line 204 has a thickness 270. For instance, the thickness 264 of the conductive material 228 of the second recessed channel 250 and the thickness 266 of the second power trace 210*a* define the thickness 270 of the second power line 204. As a result, a first portion (e.g., the conductive material 228) of the second power line 204 extends in an interior (e.g., extends inside or into) the glass substrate 102 and a second portion (e.g., the second power trace 210*a*) of the second power line 204 protrudes from an exterior of the glass substrate 102 (e.g., the conductive material 228 of the second recessed channel 250). As a result, the second power line 204 has an increased thickness (e.g., the thickness 270) in the z-direction via the second power trace 210*a* and the conductive material 228 (e.g., compared to, for example, the signal line 114 or the second power trace 210 without the conductive material 228 in the second recessed channel 250). Increasing the thickness 270 of the second power line 204 in the z-direction significantly increases a power capacity of the second power line 204 compared to a power capacity of the second power line 204 without an additional thickness (e.g., the thickness 264) of the conductive material 228 provided in the second recessed channel 250.

In the illustrated example, the thickness 246 of the first power line 202 is similar or identical to (e.g., within a 2% tolerance) of the thickness 270 of the second power line 204. However, in some examples, the thickness 246 can be different (e.g., more or less) than the thickness 270 of the second power line 204 (e.g., can be greater by than 5% or more). In the illustrated example, each of the first power line 202 and the second power line 204 is a dedicated or isolated power line. In other words, the glass substrate 102 electrically isolates the first power line 202 and the second power line 204. For instance, the overall thickness 214 of the glass substrate 102 of the illustrated example is greater than the first depth 218 of the first recessed channel 216 and the second depth 252 of the second recessed channel 250. As shown, a body 272 of the core layer 106 is positioned between the first recessed channel 216 and the second recessed channel 250. Thus, the first power line 202 does not interfere (e.g., cross-talk) with the second power line 204 and, vice versa, during operation.

Additionally, the first power line 202 and the second power line 204 are communicatively and/or electrically isolated from the signal traces 114 of the build-up layers 104. The body 272 (e.g., in the x-direction) separating the first power line 202, the second power line 204 and the signal traces 114 reduces signal loss and/or signal interference (e.g., cross-talk), thereby improving performance (e.g., improving signal integrity as the signals propagate through the signal traces 114) of the semiconductor package 100.

Figure 3A:
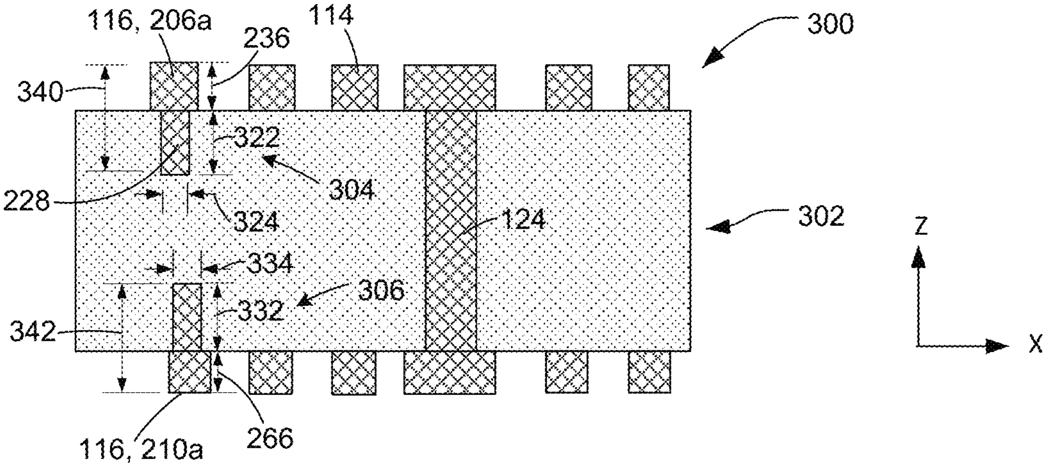
FIG. 3A is a cross-sectional view of another example glass substrate disclosed herein that can implement the example semiconductor package of FIG. 1.
Figure 3B:
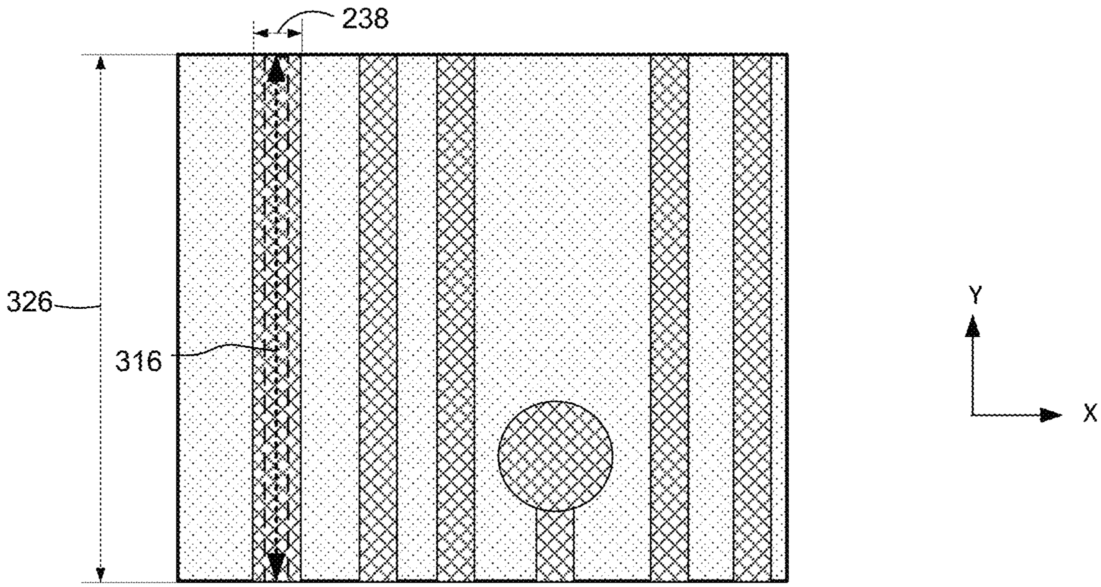
FIG. 3B is a top view of the example glass substrate and an example conductive layer of FIG. 3A.
Figure 3C:
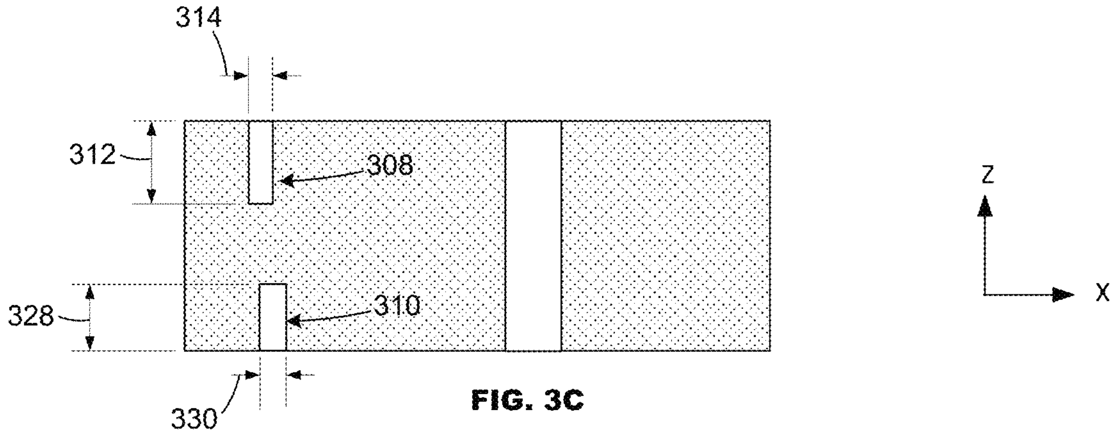
FIG. 3C is a cross-sectional view of the example glass substrate of FIG. 3A shown without conductive material.

FIG. 3A is a partial, enlarged view of another semiconductor package 300 including a glass substrate 302 disclosed herein. FIG. 3B is a top view of FIG. 3A. FIG. 3C is a partial, enlarged view of the glass substrate 302 of FIG. 3A. Many of the components of the example semiconductor package 300 of FIGS. 3A-3C are substantially similar or identical to the components described above in connection with the semiconductor package 100 of FIGS. 1A, 2A and 2B. As such, those components will not be described in detail again below. Instead, the interested reader is referred to the above corresponding descriptions for a complete written description of the structure and operation of such components. To facilitate this process, similar or identical reference numbers will be used for like structures in FIGS. 3A-3C as used in FIGS. 1, 2A-2C. For example, the semiconductor package 300 of FIGS. 3A-3C includes power traces 116, signal traces 114, and TGVs 124.

The glass substrate 302 of the illustrated example is substantially similar to the glass substrate 102 of FIGS. 1, 2A and 2C. For example, the glass substrate includes a first power line 304 and a second power line 306. The first power line 304 is defined by a first power trace 206*a* of a first conductive layer 206 and a conductive material 228 provided in a first recessed channel 308 of the glass substrate 302. The second power line 306 is defined by a second power trace 210*a* of a third conductive layer 210 and the conductive material 228 provided in a second recessed channel 310 of the glass substrate 302.

In contrast to the glass substrate 102 of FIGS. 1, 2A and 2B, the first and second recessed channels 308, 310 of the glass substrate 302 of the illustrated example have different dimensions compared to the first recessed channel 216 and the second recessed channel 250 of FIGS. 2A-2C. For example, the first recessed channel 308 includes a first depth 312 (e.g., in the z-direction), a first width 314 (e.g., in the x-direction) and a first length 316 (e.g., in the y-direction). As a result, the conductive material 228 provided in the first recessed channel 308 includes a thickness 322 (e.g., in the z-direction), a width 324 (e.g., in the x-direction), and a length 326 (e.g., in the y-direction). Similarly, the second recessed channel 310 includes a second depth 328 (e.g., in the z-direction), a second width 330 (e.g., in the x-direction) and a second length (e.g., in the y-direction). As a result, conductive material 228 provided in the second recessed channel 310 includes a thickness 332 (e.g., in the z-direction), a width 334 (e.g., in the x-direction), and a length (e.g., in the y-direction).

Thus, in the illustrated example, the first power line 304 has an overall thickness 340 defined by the thickness 236 of the first power trace 206*a* and the thickness 322 of the conductive material 228 positioned in the first recessed channel 308. The second power line 306 has an overall thickness 342 defined by the thickness 266 of the second power trace 210*a* and the thickness 332 of the conductive material 228 positioned in the second recessed channel 310.

However, in the illustrated example, the width 324 of the conductive material 228 positioned in the first recessed channel 308 is less than the width 238 (FIG. 2B) of the first power trace 206*a*. Likewise, the width 334 of the conductive material 228 positioned in the second recessed channel 310 is less than the width 238 of the second power trace 210*a*. The width 324 and the width 334 of the conductive material 228 positioned in the respective first recessed channel 308 and the second recessed channel 310 does not affect a power capacity of the first power line 304 and the second power line 306. The overall thickness 340 of the first power line 304 affects (e.g., increases or decreases) a power capacity of the first power line 304 and the overall thickness 342 of the second power line 306 affects (e.g., increases or decreases) a power capacity of the second power line 306. Thus, the greater the thickness of the power line in the z-direction increases a power capacity of the power line, the smaller the thickness of the power line in the z-direction the smaller the power capacity. For example, if the overall thickness 340 of the first power line 304 of FIGS. 3A-3C is greater than the thickness 246 of the first power line 202 of FIGS. 2A-2C, the first power line 304 of FIGS. 3A-3C is capable of handling a greater amount of power compared to the first power line 202 of FIGS. 2A-2C.

Figure 4:
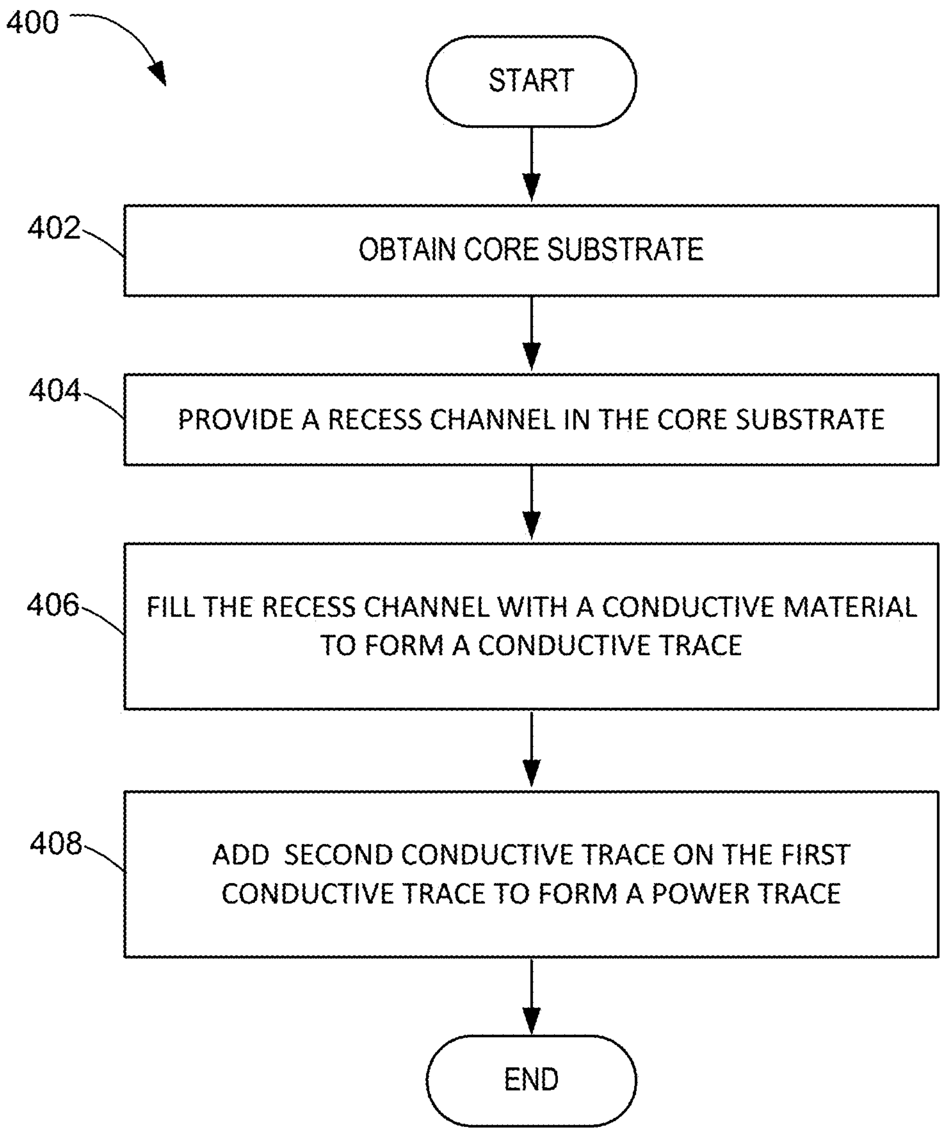
FIG. 4 is a flowchart of an example method of manufacturing an example semiconductor package disclosed herein.

FIG. 4 is a flowchart of an example method 400 of fabricating an example semiconductor package having a glass substrate disclosed herein. For example, the method 400 of FIG. 4 can be used to fabricate, create or otherwise provide the example semiconductor package 100 of FIGS. 1, 2A and 2B and/or the example semiconductor package 300 of FIGS. 3A and 3B. To facilitate discussion of the example method 400, the example method 400 will be described in connection with the example semiconductor package 100 of FIGS. 1, 2A and 2B.

Figure 5A:
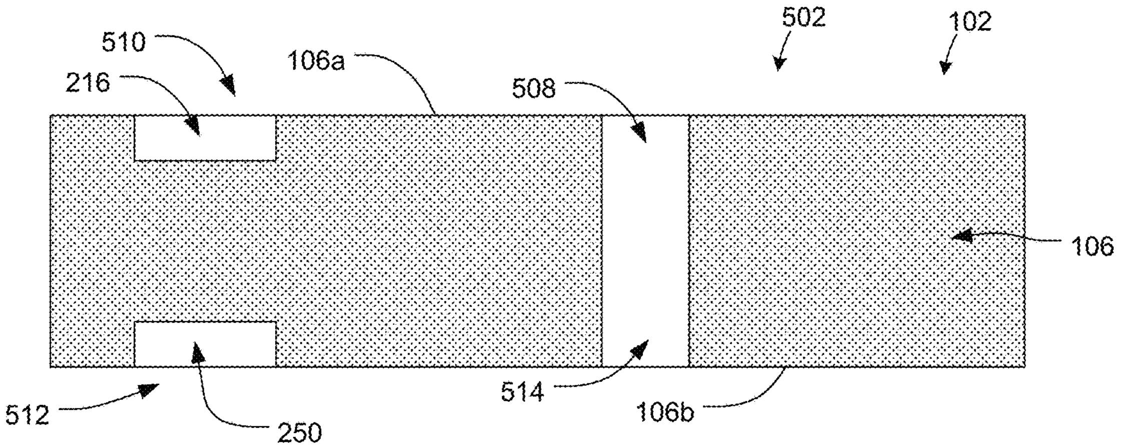
FIGS. 5A-5C depict the example glass substrate of FIGS. 2A-2C at various manufacturing stages corresponding to the example method of FIG. 4.
Figure 5B:
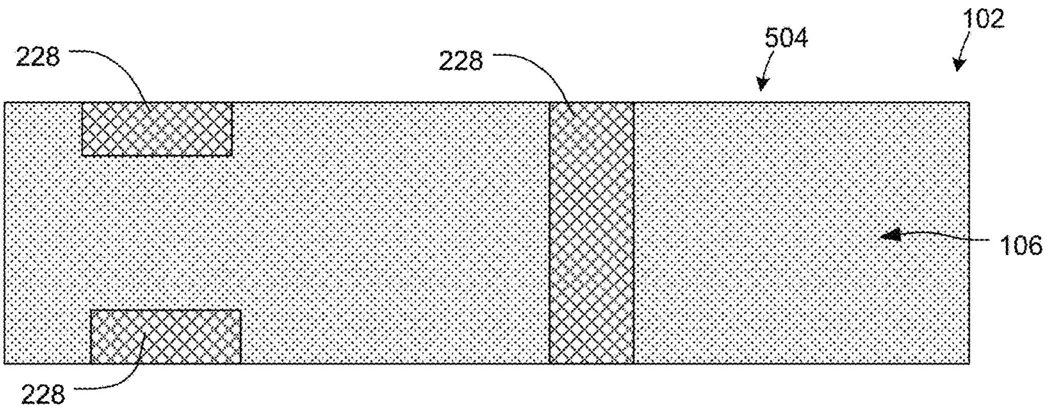
Figure 5C:
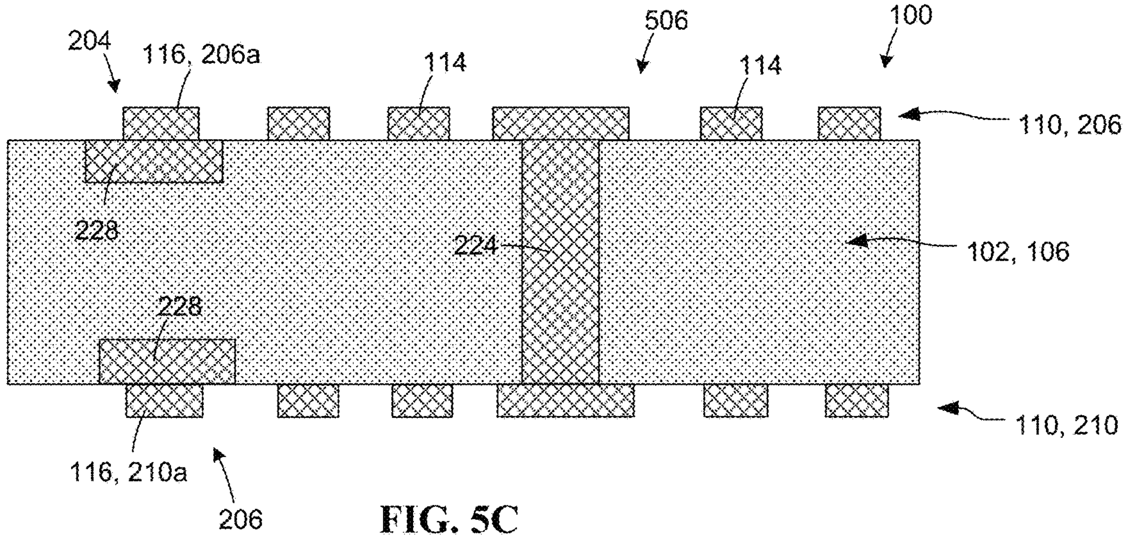

FIGS. 5A-5C are cross-sectional schematic illustrations of the example semiconductor package 100 of FIGS. 1, 2A and 2B at various manufacturing stages 502, 504, 506 corresponding to the example method 400 of FIG. 4. While an example manner of providing the example semiconductor package 100 has been illustrated in FIGS. 4 and 5A-5C, one or more of the steps and/or processes illustrated in FIGS. 4 and 5A-5C may be combined, divided, re-arranged, omitted, eliminated and/or implemented in any other way. Further still, the example methods of FIGS. 4 and 5A-5C may include processes and/or steps in addition to, or instead of, those illustrated in FIGS. 4 and 5A-5C and/or may include more than one of any or all of the illustrated processes and/or steps. Further, although the example methods are described with reference to the flowcharts illustrated in FIGS. 4 and 5A-5C, many other methods or processes of providing electronic packages or semiconductor packages may alternatively be used.

Referring to the example method 400 of FIG. 4, the method 400 begins by obtaining a glass substrate (block 402). For example, the glass substrate 102 can be obtained and can be composed of quartz or any other glass material.

A recessed channel is the provided in the glass substrate (block 404). For example, the first recessed channel 216 can be created in the first surface 106*a* and the second recessed channel 250 can be created in the second surface 106*b*. Optionally, if needed, in some examples, an opening 508 (e.g., a cylindrically shaped opening extending completely through the glass substrate 102) defining the TGV 124 can be provided in the glass substrate 102. The first recessed channel 216 and/or the second recessed channel 250 can be provided by selectively removing sections or material from the glass substrate 102. The removal of material from the glass substrate 102 can be achieved by any appropriate process, e.g., by etching, by chemical and/or mechanical polishing, using drilling (e.g., mechanical and/or laser drilling) and subsequent cleaning, and/or any other appropriate process for providing or creating such a trench or cavity. For example, creation of the first recessed channel 216, the second recessed channel 250 and the opening 508 in the glass substrate 102 can be performed via a laser drilling processes (e.g., via a laser and a chemical (e.g., hydrofluoric acid)), and/or any other semiconductor manufacturing process.

For example, a laser can be applied to respective areas 510, 512, 514 of the first surface 106*a* defining the first recessed channel 216, the second recessed channel 250 and/or the opening 508 to weaken, fracture or otherwise remove the areas 504-508 of the glass substrate 102 (e.g., laser etching, laser drilling, etc.). Subsequently, the glass substrate can be exposed to a chemical (e.g., hydrofluoric acid) to further weaken and/or remove the areas 510-514 of the glass substrate 102 to create or provide the first recessed channel 216, the second recessed channel 250 and/or the opening 508. In some examples, a photoresist layer can be applied to areas of the glass substrate 102 that do not require drilling or material removal. In other words, in some examples, a photoresist layer can be applied to areas of the first surface 106*a* and/or the second surface 106*b* that do not require material removal. In some examples, the first recessed channel 216, the second recessed channel 250 and/or the opening 508 can be provided via etching, mechanical abrasion, laser ablation, other material removal techniques and/or any other known semiconductor manufacturing technique(s). In some examples, the glass substrate 102 is provided concurrently with the creation of the example semiconductor package 100 (e.g., the build-up layers 104).

After the recessed channel has been provided in the glass substrate, the recessed channel is filled with a conductive material to create a first conductive trace (block 406). For example, referring to FIG. 5B, the conductive material 228 can be positioned in the first recessed channel 216, the second recessed channel 250 and/or the opening 508 using deposition or application technology including, but not limited to, photolithography, plating, electro-less plating, electrolytic plating, lamination, deposition techniques (such as atomic layer deposition or chemical vapor deposition), or similar techniques. In some examples, the first recessed channel 216, the second recessed channel 250 and/or the opening 508 can be filled with a conductive material (e.g., copper) via seeding and electroplating manufacturing processes. Additionally, in some examples, after the first recessed channel 216, the second recessed channel 250 and/or the opening 508 are filled with conductive material, the conductive material is polished to flush mount the conductive material with the glass substrate 102. For example, the conductive material 228 in the first recessed channel 216 and a first end of the opening 508 can be polished to flush mount the conductive material 228 relative to the first surface 106*a* and the conductive material 228 in the in the second recessed channel 250 and a second end of the opening 508 can be polished to flush mount the conductive material 228 relative to the second surface 106*b*.

A second conductive trace is then added on the first conductive trace to create a power line (block 408). For example, the first power trace 206*a* and the signal traces 114 (e.g., and the signal lines) can be coupled to the first surface 106*a* of the glass substrate 102 via the first conductive layer 206 of the conductive layers 110 of the build-up layers 104. The second power trace 210*a* and the signal traces 114 (e.g., and the signal lines) can be coupled to the second surface 106*b* of the glass substrate 102 via the third conductive layer 210 of the build-up layer 104. For example, the first power trace 206*a* and the second power trace 210*a* can be provided with the build-up layers 104. For example, the first power trace 206*a* and/or the second power trace 210*a* (e.g., and, although not shown, other build-up layers 104) can be provided on the glass substrate 102 using conventional semiconductor manufacturing techniques or processes including, but not limited to, photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of semiconductor devices.

The foregoing examples of the semiconductor packages 100 and 300 teach or suggest different features. Although each example the semiconductor package 100 and 300 disclosed above has certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Example methods, apparatus, systems, and articles of manufacture to implement semiconductor packages are disclosed herein. Further examples and combinations thereof include the following:

Example 1 includes a semiconductor package including a core layer having a thickness between a first surface opposite a second surface. The core layer includes a trench provided in the first surface. The trench partially extending between the first surface and the second surface. An electrically conductive material is positioned in the trench. A trace is provided on the conductive material. The trace is offset in a direction away from the first surface and away from the second surface of the core layer.

Example 2 includes the semiconductor package of example 1, where the conductive material is flush with the first surface of the core layer when the conductive material is positioned in the trench.

Example 3 includes the semiconductor package of examples 1 or 2, where the trace and the electrically conductive material form a power line of the semiconductor substrate, wherein the power line has a thickness that is greater than a thickness of a signal line formed in a build-up layer of the semiconductor package.

Example 4 includes the semiconductor package of any one of examples 1-3, where the trench extends in a direction between a first end of the core layer and a second end of the core layer along a path defined by the trace.

Example 5 includes the semiconductor package of any one of examples 1-4, where the core layer further includes a through glass via extending between the first surface and the second surface, the through glass via plated with metal.

Example 6 includes the semiconductor package of any one of examples 1-5, where the conductive material of the trench and the trace are to carry power.

Example 7 includes the semiconductor package of any one of examples 1-6, where the trace is positioned on the conductive material of the trench to define a power trace for transmitting power.

Example 8 includes a semiconductor package including a first layer of first traces including a first trace, the first trace defines a first thickness, and a second layer of second traces. A core layer is positioned between the first layer and the second layer. The core layer defines a first surface oriented toward the first layer and a second surface opposite the first surface oriented toward the second layer. The core layer includes a first recessed channel provided at the first surface defining a first depth. A first metal provided in the first recessed channel. The first metal has a second thickness. The first metal to align with the first trace to define a first power line of the semiconductor package. The first power line having a third thickness defined by the first thickness of the first trace and the second thickness of the first metal.

Example 9 includes the semiconductor package of example 8, where the first recessed channel extends partially into the core layer between the first surface and the second surface.

Example 10 includes the semiconductor package of any one of examples 8 and 9, where the first metal in the first recessed channel is flush with the first surface of the core layer.

Example 11 includes the semiconductor package of any one of examples 8-10, where the core layer includes a second recessed channel provided at the second surface of the core layer, the second recessed channel defining a second depth.

Example 12 includes the semiconductor package of any one of examples 8-11, further including a second metal provided in the second recessed channel, the second metal having a fourth thickness.

Example 13 includes the semiconductor package of any one of examples 8-12, where the second layer of the second traces includes a second trace defining a fifth thickness.

Example 14 includes the semiconductor package of any one of examples 8-13, where the second metal is in alignment with the second trace to form a second power line of the semiconductor package, the second power line having a sixth thickness defined by the fourth thickness of the second metal and the fifth thickness of the second trace.

Example 15 includes the semiconductor package of any one of examples 8-14, where the first power line is electrically insulated from the second power line.

Example 16 includes the semiconductor package of any one of examples 8-15, where an overall thickness of the core layer is greater than the first depth and the second depth.

Example 17 includes the semiconductor package of any one of examples 8-16, where a body of the core layer is positioned between the first recessed channel and the second recessed channel.

Example 18 includes the semiconductor package of any one of examples 8-17, where the core layer further includes one or more through glass vias (TGVs) formed in the core layer, at least one of the TGVs to extend completely through an overall thickness of the core layer between the first surface and the second surface, and wherein the at least one TGV is electrically isolated from the first metal Example 19 includes a method including providing a recessed channel in a glass substrate; filling the recessed channel with a first conductive material to create a first conductive trace in the glass substrate; and adding a second conductive material on the first conductive trace to create a second conductive trace, the first conductive trace and the second conductive trace being electrically coupled to define a power line of the semiconductor package, the power line having a first portion that protrudes into the glass substrate and a second portion that protrudes away from the glass substrate.

Example 20 includes the method of example 19, further including flush mounting the first conductive material with a first surface of the glass substrate.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A semiconductor package comprising:

a core layer having a thickness between a first surface and a second surface opposite the first surface, the core layer defined by glass extending continuously from the first surface to the second surface;

a trench extending a length along the first surface, the trench extending a depth into the core layer, the length greater than the depth;

an electrically conductive material in the trench, the electrically conductive material extending the length of the trench; and a trace on and in contact with the electrically conductive material, the trace offset in a direction away from the first surface and away from the second surface of the core layer, the trace and the electrically conductive material defining at least a portion of a power line of the semiconductor package, the power line having a thickness that is greater than a thickness of a signal line in a build-up layer of the semiconductor package.

2. The semiconductor package of claim 1, wherein a surface of the electrically conductive material is flush with the first surface of the core layer.

3. The semiconductor package of claim 1, wherein the trench extends in a direction between a first end of the core layer and a second end of the core layer along the length of the trace.

4. The semiconductor package of claim 1, wherein the core layer includes a through glass via extending between the first surface and the second surface, the through glass via plated with metal.

5. The semiconductor package of claim 1, wherein the electrically conductive material of the trench and the trace are to carry power.

6. The semiconductor package of claim 1, wherein the trace and the electrically conductive material of the trench collectively define at least a portion of a power trace to transmit power.

7. The semiconductor package of claim 1, wherein the trench has a first width, and the trace has a second width different from the first width.

8. The semiconductor package of claim 1, wherein the trace and the electrically conductive material are coextensive along a length of the power line.

9. A semiconductor package comprising:

a first layer of first traces, a first trace of the first traces having a first length along a first elongate path in a plane of the first layer, the first trace having a first thickness measured in a direction substantially perpendicular to the plane, the first length multiple times greater than the first thickness;

a second layer of second traces;

a core layer between the first layer and the second layer, the core layer having a first surface oriented toward the first layer and substantially parallel to the plane of the first layer, the core layer having a second surface oriented toward the second layer, the second surface opposite the first surface, the core layer including a recessed channel along the first surface, the recessed channel having a first depth extending substantially perpendicular to the first surface; and a first metal in the recessed channel, the first metal having a second length along a second elongate path corresponding to a shape of the recessed channel, the first metal having a second thickness measured in a direction substantially perpendicular to the first surface, the second elongate path to align with the first elongate path such that the first trace is in contact with the first metal along the second length to define a first power line corresponding to both the first metal and the first trace, the first power line having a third thickness defined by the first thickness of the first trace and the second thickness of the first metal, a second trace of the first traces extending along the first surface of the core layer in the plane of the first layer, the second trace in contact with the core layer and spaced apart from metal in the core layer between the first and second surfaces.

10. The semiconductor package of claim 9, wherein the recessed channel extends partially into the core layer between the first surface and the second surface.

11. The semiconductor package of claim 9, wherein a surface of the first metal in the recessed channel is flush with the first surface of the core layer.

12. The semiconductor package of claim 9, wherein the recessed channel is a first recessed channel, and the core layer includes a second recessed channel along the second surface of the core layer, the second recessed channel having a second depth.

13. The semiconductor package of claim 12, including a second metal in the second recessed channel, the second metal having a fourth thickness.

14. The semiconductor package of claim 13, wherein the second layer of the second traces includes a second trace having a fifth thickness.

15. The semiconductor package of claim 14, wherein the second metal is in alignment with the second trace to form a second power line of the semiconductor package, the second power line having a sixth thickness defined by the fourth thickness of the second metal and the fifth thickness of the second trace.

16. The semiconductor package of claim 15, wherein the first power line is electrically insulated from the second power line.

17. The semiconductor package of claim 12, wherein an overall thickness of the core layer is greater than a sum of the first depth and the second depth.

18. The semiconductor package of claim 12, wherein a body of the core layer is between the first recessed channel and the second recessed channel.

19. The semiconductor package of claim 9, wherein the core layer includes one or more through glass vias (TGVs) in the core layer, at least one of the TGVs to extend completely through the core layer between the first surface and the second surface, and the at least one TGV is electrically isolated from the first metal.

20. The semiconductor package of claim 9, wherein at least one side of the first trace is laterally offset relative to a corresponding side of the first metal in the recessed channel.

* * * * *